United States Patent [19]

Wada et al.

[11] 4,016,007
[45] Apr. 5, 1977

[54] METHOD FOR FABRICATING A SILICON DEVICE UTILIZING ION-IMPLANTATION AND SELECTIVE OXIDATION

[75] Inventors: Yasuo Wada, Tokyo; Hiroo Usui, Machida; Mitsumasa Koyanagi, Kokubunji; Mikio Ashikawa, Koganei, all of Japan

[73] Assignee: Hitachi, Ltd., Japan

[22] Filed: Feb. 13, 1976

[21] Appl. No.: 658,065

[30] Foreign Application Priority Data

Feb. 21, 1975 Japan .................... 50-21008

[52] U.S. Cl. .................... 148/1.5; 29/578; 148/174; 148/175; 357/49; 357/50; 357/54; 357/59; 357/91; 427/93; 427/94
[51] Int. Cl.² .................. H01L 21/76; H01L 21/265
[58] Field of Search ............ 148/1.5, 174, 175; 357/49, 50, 54, 59, 91; 427/93, 94; 29/578

[56] References Cited

UNITED STATES PATENTS

| | | | |
|---|---|---|---|
| 3,622,382 | 11/1971 | Brack et al. | 148/1.5 X |
| 3,666,548 | 5/1972 | Brack et al. | 148/1.5 X |
| 3,775,191 | 11/1973 | McQuhae | 148/1.5 |
| 3,853,633 | 12/1974 | Armstrong | 148/1.5 |
| 3,897,274 | 7/1975 | Stehlin et al. | 357/91 X |
| 3,900,350 | 8/1975 | Appels et al. | 148/174 X |
| 3,913,211 | 10/1975 | Seeds et al. | 29/578 X |
| 3,966,501 | 6/1976 | Nomura et al. | 148/1.5 |

OTHER PUBLICATIONS

Chang et al., "Fabrication for Junction Insulating Gate FET" I.B.M. Tech. Discl. Bull., vol. 13, No. 9, Feb. 1971, p. 2503.
Chou, N.J., "Self-Registered Si electrode FET" Ibid., vol. 14, No. 1, June 1971, p. 250.
Bassous, E., "Fabricating Submicrometer Silicon Devices" Ibid., vol. 15, No. 6, Nov. 1972, pp. 1823–1825.

*Primary Examiner*—L. Dewayne Rutledge
*Assistant Examiner*—W. G. Saba
*Attorney, Agent, or Firm*—Craig & Antonelli

[57] ABSTRACT

A polycrystalline silicon layer is deposited by chemical vapor deposition method at a predetermined location on an oxide film grown by thermal oxidation on a surface of a monocrystal silicon substrate. Nitrogen ions are implanted in the outer surface of the polycrystalline silicon layer and the exposed surface of the oxide film. The whole surfaces are oxidized by wet oxidation so as to form a thick oxide layer at the surface of the oxide film which is not covered by the polycrystalline silicon layer.

9 Claims, 15 Drawing Figures

METHOD FOR FABRICATING A SILICON DEVICE UTILIZING ION-IMPLANTATION AND SELECTIVE OXIDATION

FIELD OF THE INVENTION

The present invention relates to a method for fabricating a semiconductor device, and more particularly to a method wherein a dielectric isolation zone or structure is provided between different elements by an oxide film grown selectively so as to obtain a planar surface and high reliability.

DESCRIPTION OF THE PRIOR ART

It has been known that unevenness of a surface of a semi-conductor device such as an integrated circuit can cause breaking down of the conductor leads disposed on the surface. In order to maintain this unevenness of the surface as small as possible, an Isoplanar oxide-isolation technique has been proposed in Dutch patent application No. 6,614,016. By this technique a silicon nitride film is deposited by the chemical vapor deposition method on a silicon substrate. The silicon nitride film is selectively etched so as to form a mask having a predetermined pattern. A sample thus obtained is then thermally oxidized. Since the silicon nitride film prevents oxidation, a thick oxide film is formed on the surface portion which is not covered by the silicon nitride film. Since thermal oxidation proceeds by oxidizing a surface portion of the silicon substrate, i.e., a part of the oxide film is below the initial surface of the masked silicon substrate, evenness of the surface is ameliorated by this technique.

Although this new technique reduces the unevenness of the surface to about a half with respect to that obtained without using the silicon nitride film, it has another disadvantage that stress at the interface between the silicon nitride film and the silicon substrate provokes crystal defects and shortens the lifetime of minority carriers in the slicon substrate. In order to remove this advantage, it has been proposed to interpose a silicon oxide film between the silicon nitride film and the silicon substrate. However, according to experiments of the inventors, even by this new method, the lifetime of minority carriers in the silicon substrate is not ameliorated, i.e., with regard to the lifetime of minority carriers the interposed silicon oxide film has no effect. According to the experimental results of the inventors, even if a silicon oxide film as thick as 500 – 4000 A is interposed between a silicon nitride film and a silicon substrate, lifetime of minority carriers in a surface portion of the silicon substrate is 1/100 times as short as that observed for a bulk of silicon.

Aother disadvantage of this new proposed technique is that a surface portion of the silicon substrate under the edge of the silicon nitride film is oxidized by penetration of oxygen atoms and this penetration reduces the area of active regions, which will be formed under the silicon nitride film, and increases unevenness of the surface.

SUMMARY OF THE INVENTION

An object of this invention is therefore to provide a method for fabricating a silicon device, in which evenness of the surface is further ameliorated, i.e., reduced and the lifetime of minority carriers at the surface portion of the silicon device is prolonged.

In order to achieve the object of the invention, the method for fabricating a silicon device according to this invention comprises a step of growing an oxide film by thermal oxidation on a surface of a monocrystalline silicon substrate, a step of forming a polycrystalline silicon layer at at least one predetermined location on the oxide film, a step of implanting nitrogen ions in the outer surface of the polycrystalline silicon layer and the exposed surface of the oxide film and a step of fabricating a silicon device having a dielectric isolation structure formed by wet oxidation of the surfaces.

The above and other objects, features and advantages of this invention will be explained in more detail in connection with the following preferred embodiments and in conjunction with the accompanying drawing. However, it should be understood that these embodiments are not at all limitative, but there are many possible variations and modifications without departing the spirit of the invention.

DESCRIPTION OF THE PREFERRED EMBODIMENTS

Embodiment 1

Figure 1A:
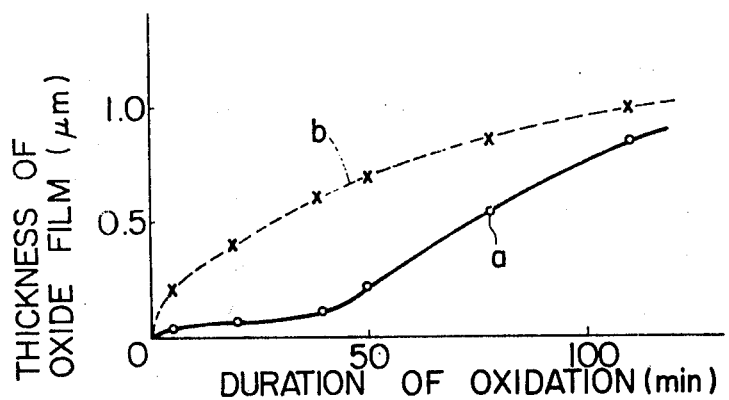
FIG. 1A represents the relationship between the thickness of an oxide film formed by wet oxidation and the duration of oxidation.
Figure 1B:
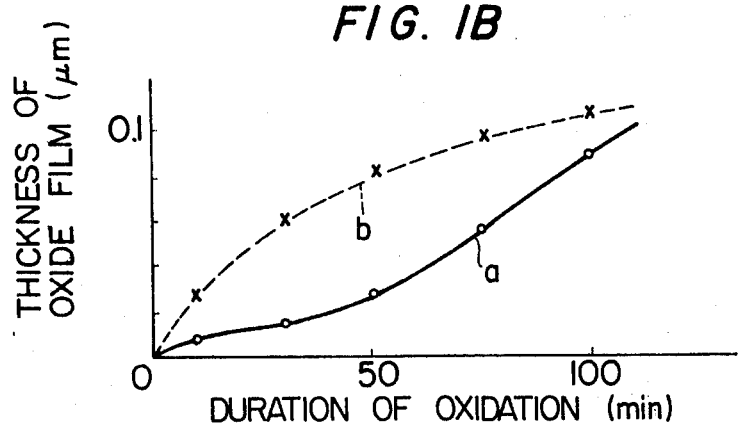
FIG. 1B represents the same relationship as that of FIG. 1A except that the oxide film is formed by dry oxidation.

Since the present invention consists of a step of implanting $N^+$ ions into a polycrystalline silicon layer and a step of forming an isolation structure by an oxide film having small differences in height between different surfaces utilizing the difference in growth speed of oxide films by wet oxidation between the ion implanted polycrystalline silicon film and a surface portion of a silicon substrate under an oxide film into which no ions are implanted, oxidation characteristics are described below in detail for the ion implanted film. Curve a in FIG. 1A represents the relationship between the thickness of an oxide film and the duration of oxidation, in the case where the oxide film is formed by wet oxidation of a polycrystalline silicon film at 1100° C, into which nitrogen ions have been implanted at an acceleration energy of 25 kV and a dose of $6 \times 10^{16}$ cm$^{-2}$ and curve b represents the same relationship for an oxide film into which no ions are implanted. After an oxidation duration longer than about 30 minutes the polycrystalline silicon layer is noticeably oxidized where the concentration of implanted nitrogen ions is maximum. After that moment the oxidation speed is more and more accelerated and after a long period the oxidation speed reaches a value almost equal to that for the film where no N⁺ ions are implanted. Consequently, under the implantation conditions described previously, the difference in the thickness of oxide film layer between the ion implanted film and the film into which no ions are implanted is largest, when a polycrystalline silicon layer deeper by about 20% than the layer, where the concentration of implanted nitrogen ions is maximum, is oxidized. Under the implantation conditions described previously, at that moment, the thickness of the oxide layer for the ion implanted film and that for the film, into which no ions were implanted, were 1000 A and 6000 A, respectively. Curve a in FIG. 1B represents the relationship between the thickness of an oxide film and the duration of oxidation, in case the former is formed by dry oxidation of a polycrystalline silicon film at 1100° C, into which nitrogen ions have been implanted under the same conditions as those for FIG. 1A, and curve b represents the same relationship for an oxide film into which no ions are implanted. As can be seen easily from this figure, after about 100 minutes of oxidation the oxidation speed for the polycrystalline silicon film, into which no ions are implanted, is almost identical to that for the implanted film, i.e., implanted nitrogen ions do not act as a mask preventing oxidation. This is because, under these conditions, implanted nitrogen ions reach the surface of the polycrystalline silicon film by diffusion to escape from it. Consequently, the difference in the thickness of oxide film formed by dry oxidation between the ion implanted film and the film, into which no ions are implanted, is at most 500 A. Therefore, dry oxidation cannot be utilized in the process for forming semiconductor devices according to this invention.

Figure 2:
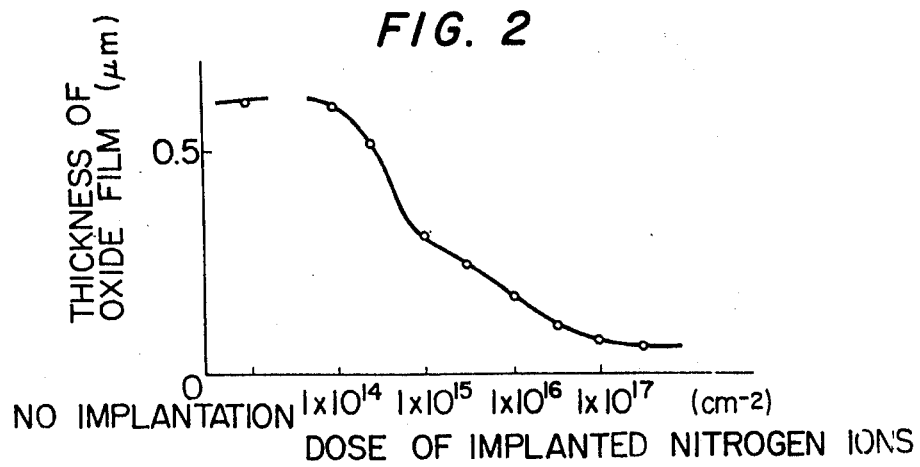
FIG. 2 is a diagram showing the relationship between the dose of implanted nitrogen ions and the thickness of oxide films formed by wet oxidation of nitrogen ion implanted polycrystalline silicon films.

As explained briefly, it is possible to form an isolation structure by an oxide film having small differences in height between different surfaces, by forming semiconductor elements in a nitrogen ion implanted polycrystalline silicon film, utilizing the difference in growth speed of oxide film by wet oxidation between the ion implanted polycrystalline silicon film and a surface portion of a silicon substrate under an oxide film into which no ions are implanted. Since, in this process, no silicon nitride film is used, there is no stress acting at the interface between the polycrystalline silicon film and the silicon substrate, and it is not necessary to take into account the influence of crystal defects, which were important for traditional Isoplanar structures. Further it should be taken into account that any layer, into which nitrogen ions are implanted at a dose of less than $1 \times 10^{15}$ cm⁻², cannot act as a mask satisfactorily preventing oxidation as shown in FIG. 2, representing the relationship between the dose of nitrogen ion implantation and the thickness of the oxide film formed by wet oxidation for 40 minutes at 1100° C. Consequently, the dose of nitrogen ion implantation should be greater than $1 \times 10^{15}$ cm⁻². Generally, the dose is from $5 \times 10^{16}$ to $3 \times 10^{17}$ cm⁻².

It is believed that the oxidation characteristics indicated above are due to an oxidation mechanism of the nitrogen ion implanted film. The relationship between the thickness of the oxide film and the oxidation duration indicated in FIG. 1A can be represented by a straight line, the gradient of which is equal to 1, if the coordinates are transformed into logarithms. This means that the oxidation mechanism is a surface controlled reaction. The corresponding straight line for the film into which no ions are implanted has a gradient equal to ½ and shows that the oxidation mechanism is a diffusion controlled reaction. These two mechanisms are thus different. For the ion implanted film, if the oxidation is further continued, the gradient of the straight line approaches ½. Thus it can be seen that an oxidation mechanism similar to that for the film into which no ions are implanted takes place also for the ion implanted film.

Figure 3:
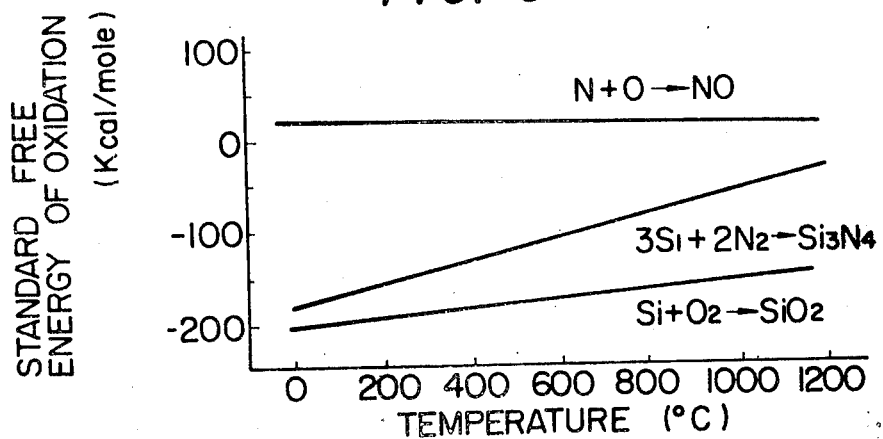
FIG. 3 shows variations of free energy of formation of silicon nitride, silicon oxide, and nitrogen oxide.

The reason why the oxidation mechanism for the ion implanted film is a surface controlled reaction is as follows. Implanted nitrogen ions form a Si—N bond, when they are exposed to high temperatures. Standard free energies of oxidation for Si and N vary as shown in FIG. 3. Consequently, if a slicon substrate that has been treated to N⁺ ion treatment is left in an oxidizing atmosphere, the Si—N bond is decomposed and forms $SiO_2$. However, since the decomposition reaction of the Si—N bond and/or the formation reaction of the Si—O bond are sufficiently slow with respect to the diffusion of oxygen in $SiO_2$, the observed oxidation mechanism is a surface controlled reaction. Thus the ion implanted film is oxidized slowly.

Figure 4A:
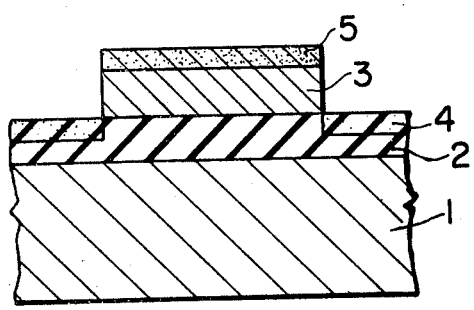
FIGS. 4A and 4B are cross-sectional views schematically showing embodiments of this invention.
Figure 4B:
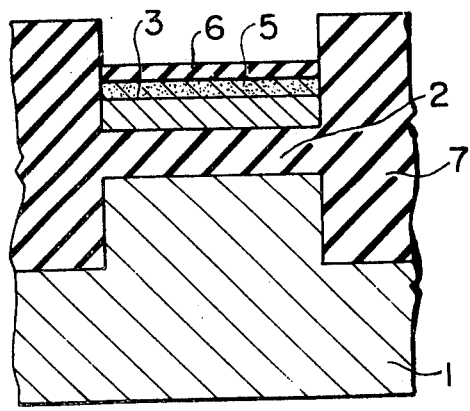

Since the standard free energy of formation for silicon oxide is greater than that for silicon nitride as shown in FIG. 3, if nitrogen ions are implanted in a silicon oxide film and the film is exposed to a high temperature, no Si—N bond is produced. Thus the film cannot act as a mask for slowing down oxidation due to the presence of Si—N bonds as described above. Consequently, when a polycrystalline silicon film into which nitrogen ions are implanted and an oxide film grown on a silicon substrate are oxidized simultaneously by wet oxidation, the polycrystalline silicon film is oxidized at the moderate rate indicated previously, while a surface portion of the silicon substrate under a silicon oxide film is oxidized without any slowing down of oxidation. This will be explained in greater detail referring to an example. As shown in FIG. 4A an oxide film 2 (i.e., $SiO_2$), 1200 A thick is grown by thermal oxidation at 1050° C on a surface (100) of an n-conductivity type silicon monocrystal substrate 1 having a resistivity of 10 Ω cm. The oxide film 2 should be thicker than 10 A and thinner than 1 μm. However, the thickness of this oxide film may be from 10 A to 1 μm. An oxide film thinner than 10 A has too great a pinhole density. For an oxide film thicker than 1 μm the method of this invention cannot give satisfactory results. Preferably the thickness is from 300 to 1500. A polycrystalline silicon film 3, 5000 A thick is deposited by thermal decomposition of monosilane $SiH_4$ on predetermined regions of the surface of the oxide film. The polycrystalline silicon film 3 should be thicker than 100 A in order to get a satisfactorily small pinhole density and effective resistance against oxidation. Generally, the polycrystalline silicom film is from 3000 to 6000 A thick. Nitrogen ions are implanted into the sample thus prepared at an acceleration voltage of 25 kV at a dose of $1 \times 10^{17}$ cm⁻². Ion implanted films 4 and 5 are formed in this way in the thermally oxidized film 2 and in the polycrystalline silicon film, respectively. FIG. 4B shows a sectional view of the sample shown in FIG. 4A after wet oxidation at 1100° C. For the reasons stated previously the ion implanted polycrystalline silicon film 5 is hardly oxidized at all and only a very thin oxide layer 6 about 2000 A is formed over the ion implanted polycrystalline silicon layer. On the other hand, since the N⁺ ion implanted silicon oxide film 4 cannot prevent oxidation, a thick oxide film 7 about 1 μm thick is formed.

Measurements on the lifetime of minority carriers in the silicon substrate under the polycrystalline silicon film show that it is as long as a lifetime of minority carriers in an untreated silicon substrate.

As indicated above, according to this invention, it is possible to form an isolation structure by oxide films having small differences in height and at the same time to control the lifetime of minority carriers in an active region of silicon. Consequently it enables to obtain a silicon substrate with excellent characteristics. When this invention is applied to oxide isolation type integrated circuits, it enables not only to reduce the surface area necessary for electronic elements and to ameliorate their reliability, but also to form electronic elements with excellent characteristics.

Embodiment 2

Figure 5A:
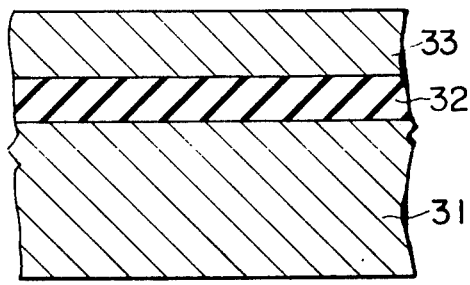
FIGS. 5A and 5E are cross-sectional views showing various production steps of a MOS type integrated circuit according to this invention.
Figure 5B:
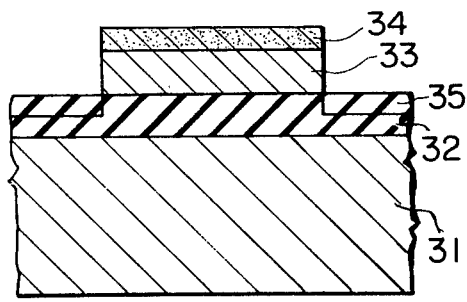
Figure 5C:
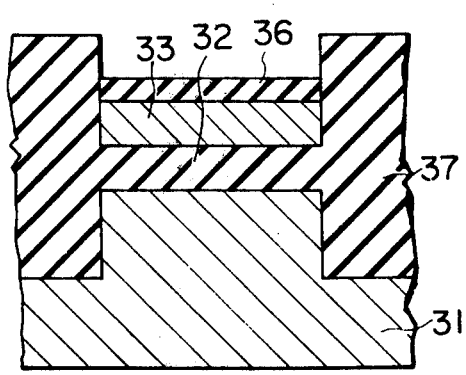

An example, in which this invention is applied to a MOS type integrated circuit, will be explained in a more concrete manner. FIG. 5A is a cross-sectional view of a silicon device, in which an oxide film 32, 1200 A thick is grown by thermal oxidation in dry oxygen at 1050° C on a (100) surface of a p-conductivity type monocrystal silicon substrate 31 having a resistivity of 10 Ω cm, and further, a polycrystalline silicon film 33, 7000 A thick is deposited on the oxide film 32 by thermal decomposition of monosilane (SiH$_4$). The polycrystalline silicon film 33 is selectively etched by the well-known photolithographic method into a predetermined pattern, as shown in FIG. 5B. Nitrogen ions N$^+$ are implanted into the exposed surface portion of the polycrystalline silicon and oxide films, 34 and 35, at an acceleration voltage of 12.5 kV at a dose of 1 × 10$^{17}$ cm$^{-2}$. The sample thus obtained is wet oxidized for 2 hours at 1100° C at a bubbler temperature of 95° C. A thin oxide film 36, 2000 A thick is formed at the surface portion of the polycrystalline silicon film 33, and the other part is covered by a thick oxide film 37, 1 μm thick, as shown in FIG. 5C. In a silicon layer into which nitrogen ions are implanted, a reaction

Figure 5D:
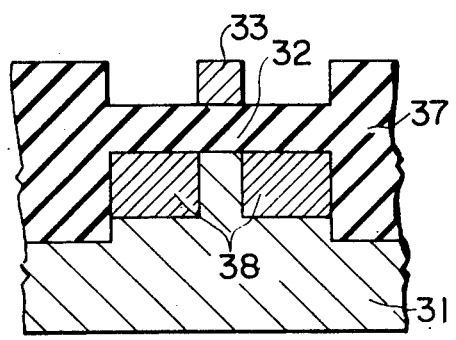
Figure 5E:
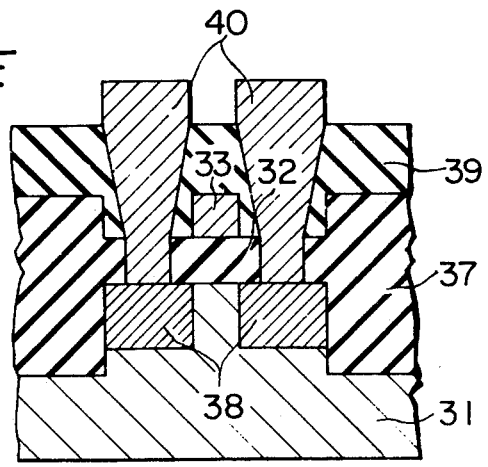

takes place and a film of Si$_3$N$_4$ thus formed acts as a mask slowing down the oxidation reaction. Consequently, the oxide film 36 is thinner than an oxide film which would be obtained if there were no Si$_3$N$_4$ film. On the other hand, in the SiO$_2$ film into which nitrogen ions are implanted, as shown in FIG. 3, nitrogen atoms are not bound with silicon atoms, because the standard free energy of formation is greater for SiO$_2$ for Si$_3$N$_4$. Consequently the silicon substrate under an SiO$_2$ film is oxidized as rapidly as a silicon substrate, which is not covered by an SiO$_2$ film, in a oxidizing atmosphere and a thick oxide film 37 is formed. The polycrystalline silicon film 33 and layer 36 and portions of layer 37 are removed by the well-known photolithographic method except for a part where a gate will be formed, and diffusion regions 38 serving as a source and drain for a MOS transistor are formed by thermal diffusion or by ion implantation using the remaining polycrystalline silicon film 33 as a mask, as shown in FIG. 5D. Other elements in the integrated circuit such as capacitors and resistors can be formed at the same time as the gate or the source. In this phase of operation, the diffusion regions 38 have a junction depth of 0.8 μm and a sheet resistivity of 30 Ω/square obtained by implanting phosphorus ions at an acceleration voltage of 150 kV at a dose of 3 × 10$^{15}$ cm$^{-2}$ and then by annealing the sample for 20 minutes at 1000° C in a dry nitrogen atmosphere. A PSG (phosphosilicate glass layer) layer 39, 8000 A thick is deposited on the whole surface of the sample by the CVD (Chemical Vapor Deposition) method using a gaseous mixture of monosilane (SiH$_4$), oxygen (O$_2$) and phosphine (PH$_3$), as shown in FIG. 5E. After having removed predetermined regions of the PSG layer 39, an aluminum layer 40, 1 μm thick is deposited further on the PSG layer 39 by the vacuum evaporation method and selectively etched by the photolithographic method into predetermined patterns.

MOS transistors fabricated by the method described above had characteristics which were better than those of MOS transistors fabricated by the traditional Isoplanar technique. When electric current in the reverse direction of a p-n junction formed in a silicon substrate under a silicon nitride film and that of a p-n junction formed in a silicon substrate under a polycrystalline silicon film into which nitrogen ions are implanted, are compared, the latter is smaller by one order than the former. This result corresponds well to the lifetime values of minority carriers in a silicon substrate mentioned previously. Moreover, in the device according to the invention, since the oxide film grown at first is used as an insulating layer for the gate, it is obvious that deterioration of the silicon substrate by thermal recycling is small and that characteristics at the interface between silicon and silicon oxide are excellent. As indicated above, considerable methods are gained by applying this invention to semiconductor devices.

When the method according to this invention is applied to MOS type integrated circuits apart from the excellent characteristics obtained for MOS transistors indicated above, another object of this invention, i.e., reliability of conductors is enhanced, because differences in height between different surfaces of semiconductor elements are small. The reason why the differences in height between different surfaces of semiconductor elements are reduced is due to the fact that a part of a thick oxide film 37 for the isolation of different elements is buried in the silicon substrate 31, as shown in FIGS. 5C to 5E, so that differences in height between different surfaces are reduced to about one half with respect to those of traditional types of semiconductor devices. Consequently, defects in conductors, which were a serious problem in traditional types of semiconductor devices, can be almost completely eliminated and the reliability of semiconductor elements and the production yield are considerably ameliorated. For this reason, technical advances due to this invention are very great.

Embodiment 3

Figure 6A:
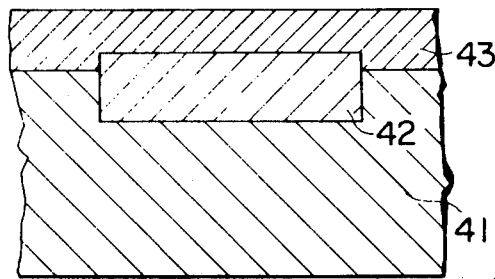
FIGS. 6A and 6D are cross-sectional views showing various production steps of a bipolar integrated circuit according to this invention.
Figure 6B:
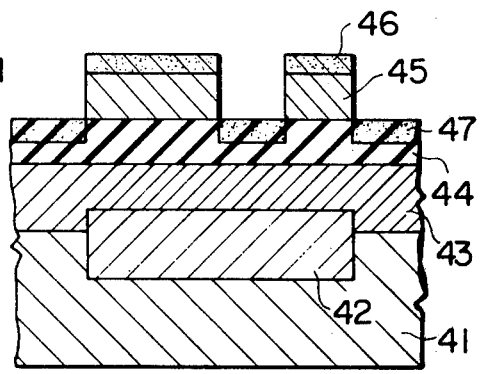
Figure 6C:
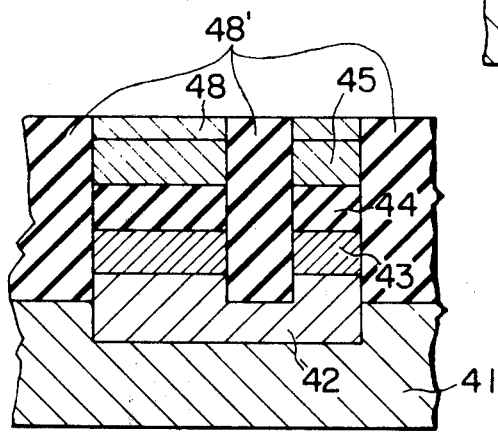

An embodiment in which this invention is applied to form a bipolar integrated circuit is described as follows: FIG. 6A is a cross-sectional view of a silicon device, in which a n$^+$-conductivity-type buried diffusion layer 42 (which has a junction depth is about 1 μm and a surface resistivity of 10 Ω/square) is formed on a (111) surface of a p-conductivity-type silicon monocrystal substrate 41 having a resistivity of 20 Ωcm by the thermal diffusion method using POCl$_3$ as a diffusion source, and an n-conductivity type epitaxial layer 43, 0.8 μm thick, having a resistivity of 1 Ωcm is formed by reducing tetrachlorosilicon using hydrogen. The n$^+$-conductivity type buried diffusion layer 42 penetrates into the n-conductivity type epitaxial layer 43 during the thermal epitaxial growth process. The sample thus obtained is oxidized in dry oxygen so that an oxide film 44, 1200 A thick is formed on the n-conductivity type layer. A polycrystalline silicon film 45 is deposited on predetermined regions of the upper surface of the oxide layer by thermal decomposition of monosilane $SiH_4$. Nitrogen ions are projected by the ion implantation method on the polycrystalline silicon film 45 and on the exposed surface of the oxide film 44 to form a nitrogen ion implanted film 46 in the polycrystalline silicon film and a nitrogen ion implanted film 47 in the oxide film, as shown in FIG. 6B. Nitrogen ions are implanted at an acceleration voltage of 25 kV at a dose of $1 \times 10^{17}$ $cm^{-3}$. Then a thick oxide film 48 is grown by wet oxidation at 1100° C using the nitrogen ion implanted film 46 in the polycrystalline silicon layer as a mask, as shown in FIG. 6C. As already mentioned, the nitrogen ion implanted film in the oxide layer 44 does not act as an antioxidation mask. Consequently, a thin oxide film 48, 2000 A thick is grown on the polycrystalline film 46 into which nitrogen ions are implanted, while a thick oxide film 48', 1.6 μm thick is grown on the other region. A part of the oxide film 1.6 μm thick is formed by a surface portion of the p conductivity type substrate 41 oxidized thermally, which completely isolates the semiconductor element.

Figure 6D:
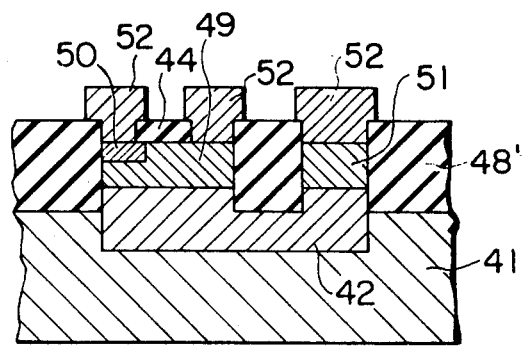

FIG. 6D shows a sectional view of a completely finished bipolar transistor, in which a base 49, an emitter 50, and a collector 51 are formed by the traditional thermal diffusion method, and aluminum electrodes 52 are deposited. Since, by forming bipolar integrated circuits by the method mentioned above, satisfactory surface structures, which cannot be obtained by the traditional method, can be obtained, semiconductor elements having a small surface recombination speed can be obtained. Therefore satisfactory results are obtained, when this method is applied, e.g., to low noise devices.

As explained in detail referring to the embodiments according to this invention, it is possible to obtain more planar structures than those obtained by the traditional method and to ameliorate considerably the characteristics and reliability of semiconductor devices by growing a thick oxide film at a predetermined surface region and a thin oxide film on a polycrystalline silicon film, in which nitrogen ions are implanted, by wet oxidation. Moreover, according to this invention it is possible to ameliorate the crystallographical properties of active regions and therefore the characteristics of semiconductor devices, because the lifetime of minority carriers in the regions, in which they are formed, can be maintained at a desirable value.

The oxidation temperature can be set between 900° and 1250° C. Good results are obtained especially in a temperature range between 1000° and 1100° C. The moisture content of the oxidizing atmosphere can be set between 5 and 100%. However, good results are obtained especially between 50 and 90%. Inert gas such as nitrogen and/or argon can be mixed to the oxidizing atmosphere. The oxidizing pressure can be set at a moderate value.

What is claimed is:

1. A method for fabricating a semiconductor silicon device comprising:
    1. growing an thin silicon oxide film by thermal oxidation on a surface of a monocrystal silicon substrate;
    2. forming a polycrystalline silicon film at at least one predetermined location on said thin oxide film;
    3. implanting nitrogen ions at a dose level greater than $1 \times 10^{15}$ $cm^{-2}$ in the outer surface of said polycrystalline silicon film and the exposed surface of said thin oxide film; and
    4. forming a thick silicon oxide film serving as dielectric isolation structure by wet oxidation of the exposed surfaces.

2. A method for fabricating a silicon device according to claim 1, in which the thickness of said thin silicon oxide film is between 10 A and 1 μm.

3. A method for fabricating a silicon device according to claim 1, in which the thickness of said polycrystalline silicon film is greater than 100 A.

4. A method for fabricating a silicon device according to claim 1, in which the thickness of said polycrystaline silicon film is from 3000 to 6000.

5. A method for fabricating a silicon device according to claim 1, further comprising:
    5. removing said polycrystalline silicon film except for a central part, where a gate of a MOS type transistor should be formed, by the photolithographic method;
    6. diffusing impurity atoms of a conductivity type which is opposite to that of said substrate by using the remaining part of said polycrystalline silicon film and said thick oxide film as a diffusion mask so as to form a source and drain of the MOS type transistor;
    7. depositing a phosphosilicate glass layer on the whole surface;
    8. removing predetermined regions of said phosphosilicate glass layer;
    9. forming an aluminum layer on the whole surface by the vacuum evaporation method; and
    10. etching selectively said aluminum layer by the photolithographic method so as to form gate, source and drain electrodes.

6. A method for fabricating a silicon device according to claim 1, further comprising:
    5. removing said polycrystalline silicon film except for a central part, where a gate of a MOS type transistor should be formed, by the photolithographic method;
    6. implanting impurity ions of a conductivity type which is opposite to that of said substrate by accelerating the ions, so that the ions reach said substrate through said thin oxide film but the ions can pass neither through the remaining part of said polycrystalline silicon film nor through said thick oxide film, so as to form a source and drain of the MOS type transistor;
    7. depositing a phosphosilicate glass layer on the whole surface;
    8. removing predetermined regions of said phosphosilicate glass layer;
    9. forming an aluminum layer on the whole surface by the vacuum evaporation method; and
    10. etching selectively said aluminum layer by the photolithographic method so as to form gate, source and drain electrodes.

7. A method for fabricating a silicon device according to claim 1, in which the wet oxidation is effected at temperatures of from 1000° to 1100° C and with a water content expressed as a humidity of from 50 to 90%.

8. A method for fabricating a silicon device according to claim 1, in which the thick silicon oxide film has a thickness of from 0.5 to 20 μm.

9. A method for fabricating a bipolar silicon device comprising:
   1. diffusing an n conductivity type impurity at a predetermined region on a surface of a p-conductivity type silicon substrate;
   2. growing an n conductivity type epitaxial layer, said n conductivity type impurity diffusing into a bottom portion of said epitaxial layer so as to form a high impurity concentration buried layer;
   3. growing an thin oxide film by thermal oxidation on a surface of said epitaxial layer;
   4. forming a polycrystalline silicon film at a predetermined location on said thin oxide film, which is over said high impurity concentration buried layer;
   5. implanting nitrogen ions at a dose level greater than $1 \times 10^{15}$ cm$^{-2}$ in the outer surface of said polycrystalline silicon layer and the exposed surface of said thin oxide film;
   6. forming a thick oxide film reaching said high impurity concentration buried layer by wet oxidation of the surfaces so as to form an isolated n conductivity type region; and
   7. forming an emitter, a base and a collector in said isolated region by thermal diffusion.

* * * * *